United States Patent
Overweg

(10) Patent No.: US 12,394,549 B2
(45) Date of Patent: Aug. 19, 2025

(54) CRYOGEN-FREE SUPERCONDUCTING MAGNET SYSTEM

(71) Applicant: KONINKLIJKE PHILIPS N.V., Eindhoven (NL)

(72) Inventor: Johannes Adrianus Overweg, Uelzen (DE)

(73) Assignee: Koninklijke Philips N.V., Eindhoven (NL)

( * ) Notice: Subject to any disclaimer, the term of this patent is extended or adjusted under 35 U.S.C. 154(b) by 84 days.

(21) Appl. No.: 18/030,780

(22) PCT Filed: Sep. 23, 2021

(86) PCT No.: PCT/EP2021/076151
§ 371 (c)(1),
(2) Date: Apr. 7, 2023

(87) PCT Pub. No.: WO2022/073768
PCT Pub. Date: Apr. 14, 2022

(65) Prior Publication Data
US 2023/0377787 A1    Nov. 23, 2023

(30) Foreign Application Priority Data
Oct. 9, 2020  (EP) .................................... 20200942

(51) Int. Cl.
*H01F 6/04* (2006.01)
*G01R 33/38* (2006.01)
(Continued)

(52) U.S. Cl.
CPC ........... *H01F 6/04* (2013.01); *G01R 33/3804* (2013.01); *G01R 33/3815* (2013.01); *H01F 6/06* (2013.01)

(58) Field of Classification Search
None
See application file for complete search history.

(56) References Cited

U.S. PATENT DOCUMENTS 5,302,928 A    4/1994  Laskaris et al.
5,396,206 A    3/1995  Herd et al.
(Continued)

FOREIGN PATENT DOCUMENTS

GB    2476716 A    7/2011

OTHER PUBLICATIONS

International Search Report and Written Opinion From PCT/EP2021/076151 Mailed Jan. 18, 2022.

*Primary Examiner* — Jermele M Hollington

(57) ABSTRACT

A cryogen-free superconducting magnet system includes a cryocooler configured to cool a superconducting coil. The superconducting coil is arranged inside a vacuum chamber at a distance from vacuum chamber walls. The superconducting coil includes two superconducting coil connectors galvanically connected to two current leads fed through a vacuum chamber wall to provide the superconducting coil with an electric current from outside of the vacuum chamber. Each current lead includes a first section and a second section, wherein the cross-sectional area of the first section is less than the cross-sectional area of the second section. The current leads are galvanically attached to the superconducting coil connectors and thermally connected to the first stage of the refrigerator with their respective second sections. The first sections of the current leads each include a cooling arrangement for cooling the first sections of the current leads by heat transfer to the outside at ambient temperature.

20 Claims, 2 Drawing Sheets

(51) Int. Cl.
    *G01R 33/3815*    (2006.01)
    *H01F 6/06*    (2006.01)

(56) References Cited

U.S. PATENT DOCUMENTS

| | | | |
|---|---|---|---|
| 5,737,927 A * | 4/1998 | Takahashi | H01F 6/04 |
| | | | 62/51.1 |
| 10,107,543 B2 * | 10/2018 | Pourrahimi | F25D 19/006 |
| 2005/0062473 A1 * | 3/2005 | Ryan | H01F 6/04 |
| | | | 324/318 |
| 2010/0051307 A1 | 3/2010 | Tigwell et al. | |
| 2013/0203603 A1 | 8/2013 | Harrison | |
| 2014/0028316 A1 | 1/2014 | Mine et al. | |
| 2015/0243423 A1 * | 8/2015 | Pourrahimi | G01R 33/48 |
| | | | 324/322 |
| 2018/0320936 A1 * | 11/2018 | Regnat | F25B 9/10 |
| 2019/0108932 A1 | 4/2019 | Wikus et al. | |
| 2024/0077554 A1 * | 3/2024 | Solovyov | G01R 33/3804 |
| 2024/0304368 A1 * | 9/2024 | Ebara | H01F 6/04 |

* cited by examiner

CRYOGEN-FREE SUPERCONDUCTING MAGNET SYSTEM

CROSS REFERENCE TO RELATED APPLICATIONS

This application is a U.S. national phase application of International Application No. PCT/EP2021/076151 filed on Sep. 23, 2021, which claims the benefit of EP Application Serial No. 20200942.9 filed on Oct. 9, 2020 and is incorporated herein by reference.

FIELD OF THE INVENTION

The invention relates to the field of cryogen-free superconducting magnets and in particular to a cryogen-free superconducting magnet system with a superconducting coil for generating a magnetic field, a vacuum chamber with vacuum chamber walls limiting the vacuum chamber to the outside, and a cryocooler for cooling the superconducting coil, wherein the superconducting coil is arranged inside the vacuum chamber at a distance from the vacuum chamber walls and the superconducting coil is equipped with two current leads which are feed through a vacuum chamber wall for providing the coil with an electric current from outside of the vacuum chamber.

BACKGROUND OF THE INVENTION

Typically, cryogen-free superconducting magnet systems may be mechanically cooled down to 4.2 K eliminating the need for liquid cryogens and, hence, avoiding the issues associated with handling liquid cryogens. However, the operating temperature of the system can also have values between 10 and 30 K when higher temperature superconductors are used for the superconducting magnet. Therefore, cryogen-free superconducting magnet are advantageous since they provide for easier handling because no liquid cryogens has to be transferred and since the purchase of expensive liquid helium may be avoided. Further, the handling of cryogen-free system operation is easier and less maintenance is required.

Cryogen-free magnets, also called Helium-less magnets, where the coil is placed in the insulating vacuum of a cryostat need to have permanently installed current leads which cannot be cooled by bleeding gas from a liquid helium reservoir. Thus, these leads cause a relatively large heat load on the system's refrigerator. For magnets operating most of the time at constant field in persistent mode, such as magnetic resonance imaging (MRI) magnets, the heat load at zero current in the current leads is the most problematic.

U.S. Pat. No. 5,302,928 describes current leads for a superconducting magnet system of the type that are constructed of two-stages. Such structures of this type, generally, operate from ambient temperature to the temperature at the thermal shield and from the temperature of the thermal shield to that of the magnet such that ohmic losses are reduced.

Though the prior art addresses reducing the heat load to a conduction cooled superconducting magnet no solution for addressing the problem of the heat load at zero current in the current leads in cryogen-free superconducting magnet systems is provided.

The US-patent application US2019/1908932 discloses a magnet system with permanently installed current leads with a variable cross section area. The current leads may be additionally cooled via the radiation shield that is coupled to an upper cooling stage of the active cooling device. Moreover, the current leads are coupled to cold reservoirs e.g. in the form of metallic masses.

SUMMARY OF THE INVENTION

It is an object of the invention to provide a cryogen-free superconducting magnet system in which excess heat load at zero current in the current leads is removed without the risk of thermal runaway.

According to the invention, this object is addressed by the subject matter of the independent claim. Preferred embodiments of the invention are described in the dependent claims.

Therefore, according to the invention, a cryogen-free superconducting magnet system is provided which comprises a superconducting coil for generating a magnetic field,
a vacuum chamber with vacuum chamber walls limiting the vacuum chamber to the outside, and
a cryocooler for cooling the superconducting coil, the cryocooler comprising a refrigerator with a first stage which is adapted for being cooled to a first temperature and a second stage which is adapted for being cooled to a second temperature, the second temperature being lower than the first temperature, wherein
the superconducting coil is arranged inside the vacuum chamber at a distance from the vacuum chamber walls,
the superconducting coil is equipped with two superconducting coil connectors which are galvanically connected to two current leads which are fed through a vacuum chamber wall for providing the superconducting coil with an electric current from outside of the vacuum chamber,
each current lead comprises a first section and a second section, wherein the cross-sectional area of the first section is less than the cross-sectional area of the second section,
the current leads are galvanically attached to the superconducting coil connectors and thermally connected to the first stage of the refrigerator with their respective second sections, and
the first sections of the current leads each comprise a cooling arrangement for cooling the first sections of the current leads by heat transfer to the outside at ambient e.g. room temperature.

Hence, it is an important aspect of the invention that the current leads each comprise at least two different sections with different cross sections, wherein the current leads are attached to the superconducting coil connectors with their sections which comprise greater cross sections. In this way, the heat transfer through the current leads is reduced due to their sections with smaller cross sections. Further, it is of importance that the first sections of the current leads are cooled by a cooling arrangement. In this way, the heat leak to the first stage of the refrigerator for the situation where the current in the leads is small or zero may be reduced. The ends of the second sections of the current leads are thermally anchored to the first stage of the refrigerator which provides for the advantage that the high temperature superconducting connections are always maintained in their superconducting state.

In general, a suitable shape of a current lead for a cryogen-free magnet is a strip of bar of a conducting material such as copper with a constant cross-section over its entire length. According to the current invention, the cross-sectional area in a section of the current lead which is in a distance from the coil is reduced over a certain length of the lead. Without cooling, when conducting the current for the coil, this thin section of the lead would quickly heat up to temperatures above the melting point of its material. In order to prevent such thermal runaway, the thin section of the lead is equipped with a cooling arrangement.

In general, at least reducing the cross-sectional area of the current leads somewhere along their length is already suitable for reducing the heat load. However, according a preferred embodiment of the invention, the current leads are fed through the wall of the vacuum chamber with their first sections. In this way, the heat transfer along the current leads is further reduced. Further, according to a preferred embodiment of the invention, the cross-sectional areas of the first sections of the current leads are less than 25%, preferably less than 20%, most preferably less than 15%, the cross-sectional areas of the second sections. Furthermore, according to a preferred embodiment of the invention, the cross-sectional areas of the second sections of the current leads are dimensioned in a way to thermally withstand a predefined maximum current which is to be fed to the superconducting coil without cooling while the cross-sectional areas of the first sections of the current leads are dimensioned in a way which is not suited for thermally withstanding the predefined maximum current which is to be fed to the superconducting coil without cooling. Preferably, the predefined maximum current is 400 A, more preferably 450 A.

In general, the current leads may be made of different materials along their length. However, according to a preferred embodiment of the invention, the current leads are comprised of the same material in their first sections and their second sections. Preferably, the current least are completely made of copper.

When the current leads are permanently installed with feed-trough through the vacuum chamber walls they will constitute an additional unwanted heat leak into the magnet, which is kept small to avoid additional heat load on the refrigerator. The narrow first section of each current lead forms an increased thermal resistance in the current leads in the situation of zero electrical current, i.e. when the magnet operates in persistent mode where electrical current runs in the superconducting coil in its superconducting state at zero electrical resistance. When ramping the magnet up or down electrical currents are fed to or withdrawn from the superconducting coil via the current leads, then in the narrow first sections having a relatively high electrical resistance the heat dissipation increases (by I²R) and temperature in the narrow first sections will increase. In order to avoid so-called thermal run-away of the current leads where the increased heat dissipation at the narrow first sections may cause damage to the current leads, heat is extracted from the narrow first portions at their room-temperature ends The heat extraction is preferably done by free convection of ambient air by providing sufficient cooling surface e.g. by using cooling fins mounted to the outside of the current leads. Heat transport from the narrow portions when they are carrying current during ramp-up/downs may be enhanced by way of fluid cooling or preferably by way of using a heat pipe for the narrow portion of the current leads. The efficient heat transfer to the outside at room temperature achieves that heat from the narrow portions can continuously extracted without an upper limit to the duration of the cooling of the narrow portions because the heat capacity of the outside is (virtually) infinite relative to the amount of heat generated by the increased dissipation. This is essentially different from conventional enthalpy driven cooling by providing a (finite) amount of fluid or solid cold matter, e.g. from a buffer or cold (He) gas. Owing to the heat extraction (e.g. by fluid cooling or by way of the heat pipe) heat transport from the narrow first portions to the outside at room temperature is much higher than the heat transport along the (larger cross-section) second portions. In the zero-current state the thermal resistance of the narrow upper sections of the current leads is much higher than that of the thicker lower sections. This strongly reduces the unwanted heat leak through the feed-through. When heat pipes are used this is achieved in a passive way because the working fluid of the heat pipes will freeze out at their lower ends and the inside of the rest of the heat pipes is then essentially a vacuum. When the upper sections of the heat pipes are cooled by forced fluid flow, stopping this flow will lead to freezing of the coolant, which has a low thermal conductivity in its frozen state.

The invention allows for different designs of the current leads in their respective different sections However, according to a preferred embodiment of the invention, the length of the first sections of the current leads is at least 60%, preferably at least 80%, most preferably more than 100%, of the length of the second sections of the current leads. In this way, undesired heat transfer through the current leads may be further reduced.

Different types of cooling arrangements may be used for the invention. According to a preferred embodiment of the invention, the cooling arrangements for cooling the first sections of the current leads each comprise a cooling channel inside the first section of the respective current lead for conducting a coolant. In this respect, according to a preferred embodiment of the invention, both current leads comprise a common cooling channel. This allows for an easy and efficient design of the cooling arrangement. According to a preferred embodiment of the invention, this common cooling channel is comprised of a respective cooling channel in the first sections of the current leads and a galvanically insulating coupler interconnecting the cooling channels in the first sections of the respective current leads. In this way, the two leads are thermally connected, i.e. for the purpose of cooling while they still galvanically isolated from each other.

Excess heat may be dissipated in different ways. According to a preferred embodiment of the invention, the cooling arrangements for cooling the first sections of the current leads each comprise a heat pipe with which the current leads are fed through the wall of the vacuum chamber, which extends into the inside of the vacuum chamber, and which is connected to a heat sink outside of the vacuum chamber. In this respect, according to a preferred embodiment of the invention, the heat pipes are formed by the first sections of the current leads, respectively.

The invention also relates to a MRI system with a cryogen-free superconducting magnet system as described above, and to a method of use of a cryogen-free superconducting magnet system as described above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
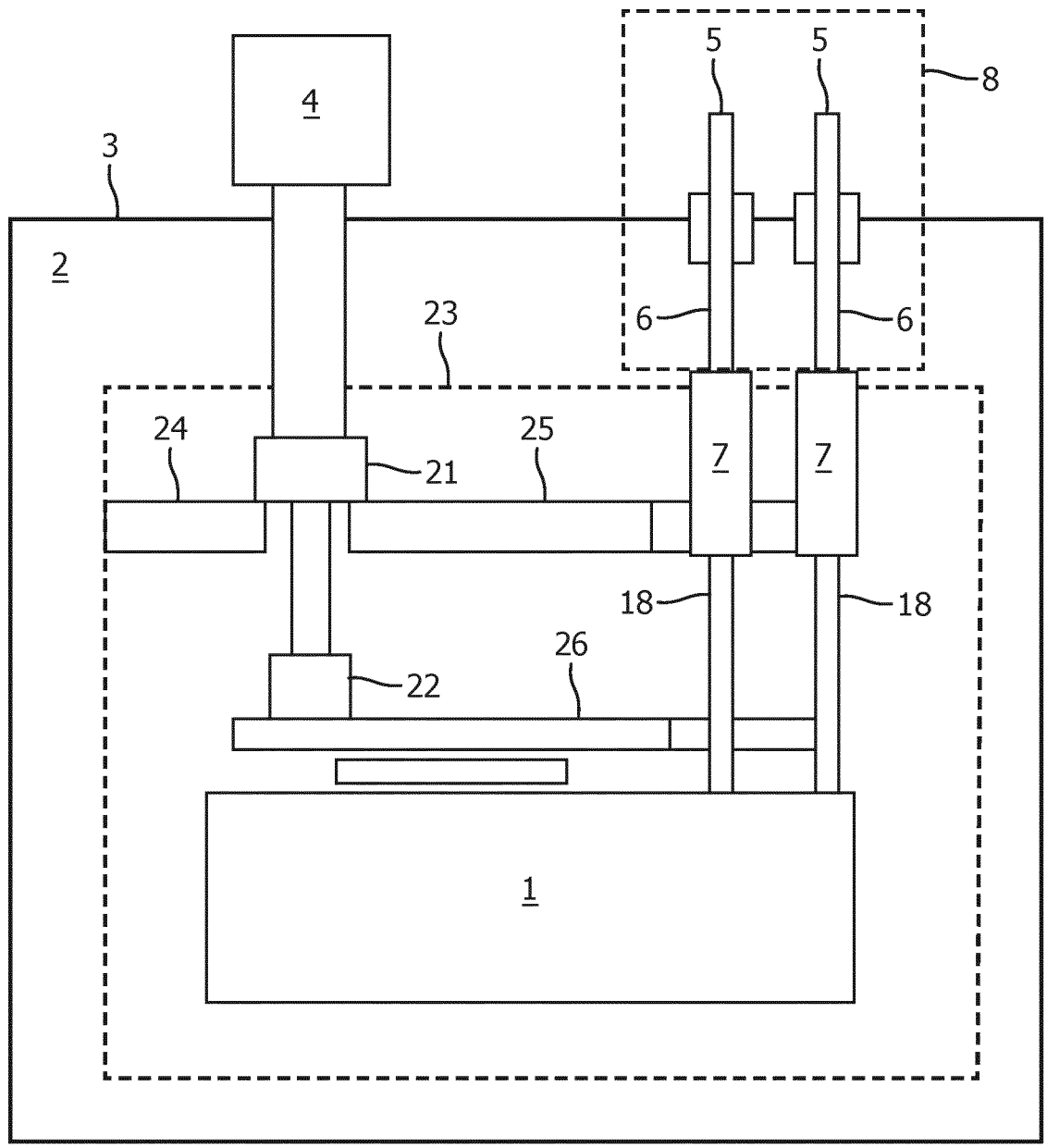
FIG. 1 schematically depicts a MRI system according to a preferred embodiment of the invention.
Figure 2:
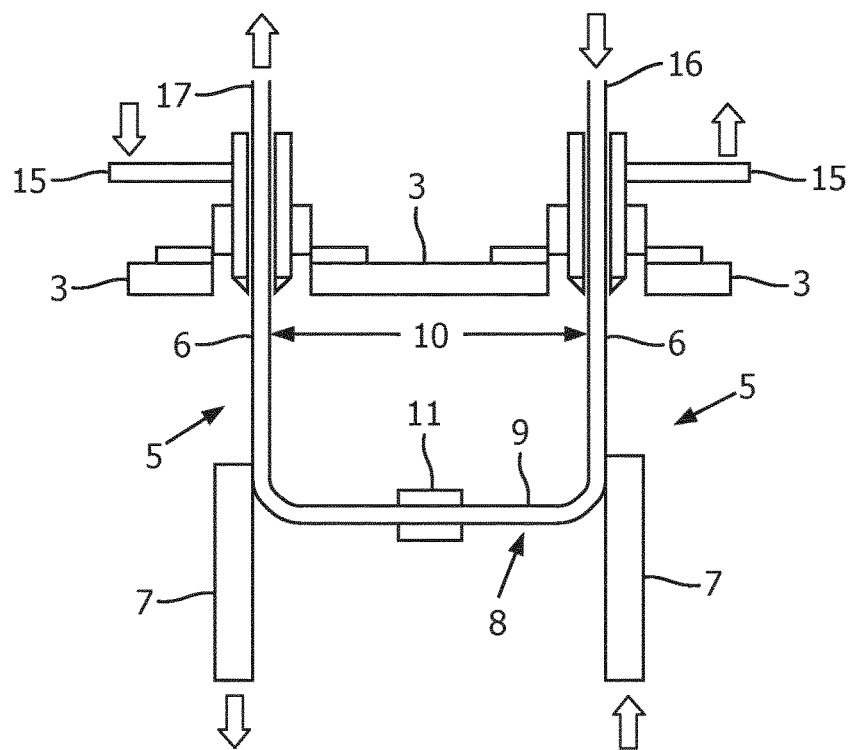
FIG. 2 schematically depicts a first embodiment of the current leads and the cooling arrangement in more detail.

As can be seen from FIG. 1 in combination with FIG. 2, the MRI system comprises a cryogen-free superconducting magnet system with a superconducting coil 1 for generating a magnetic field, a vacuum chamber 2 with vacuum chamber walls 3 limiting the vacuum chamber 2 to the outside, and a cryocooler 4 with a refrigerator for cooling the superconducting coil 1. Further, the superconducting magnet system comprises a radiation screen 23 which surrounds most of the parts of the cryogen-free superconducting magnet system which are arranged inside the vacuum chamber 2. The superconducting magnet system is operated in persistent mode; the leads to the superconducting coil 1 do not carry any current except when the magnetic field due to the superconducting coil 1 has to be changed.

The refrigerator of the cryocooler 4 has at least two thermal interfaces where heat is absorbed, i.e. a first stage 21 which typically has a temperature of 40 K and is mainly used to cool the radiation screen 23 of the superconducting magnet system through a thermal link 24, and a second stage 22 which typically reaches a temperature of 3-5 K and mainly cools the superconducting coil 1 through a thermal link 26. The superconducting coil 1 is arranged inside the vacuum chamber 2 and inside and not touching the radiation screen 23. The superconducting coil 1 is equipped with two superconducting coil connectors 18 which are galvanically connected to two current leads 5 which are feed through a vacuum chamber wall 3 for providing the superconducting coil 1 with an electric current from outside of the vacuum chamber 2.

Figure 3:
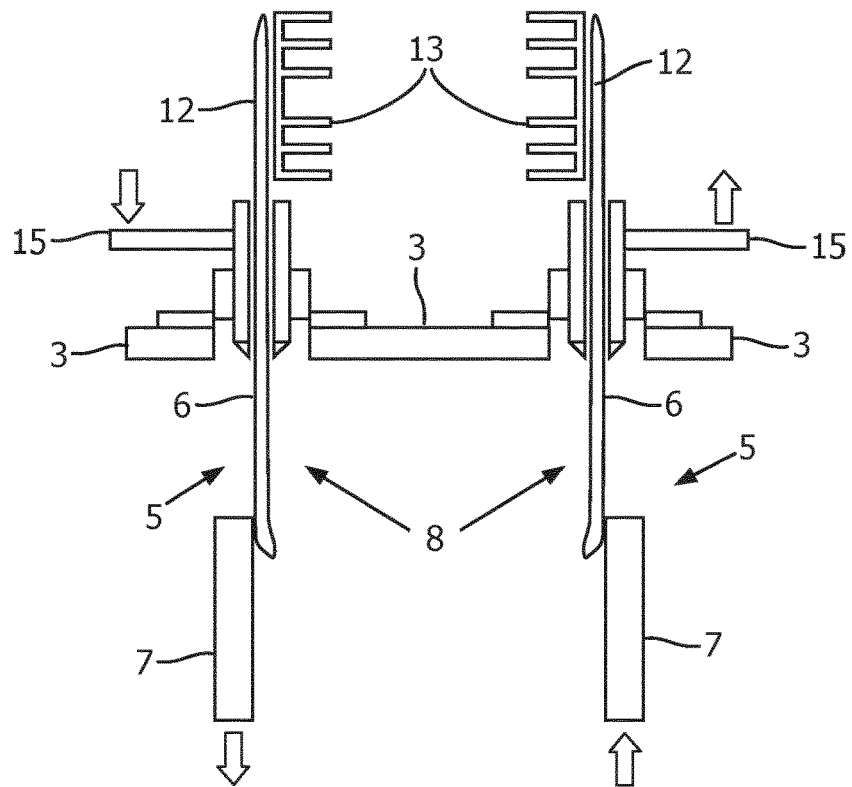
FIG. 3 schematically depicts a second embodiment of the current leads and the cooling arrangement in more detail.

The superconducting coil connectors 18 are made from high temperature superconducting (HTS) material and are thermally anchored through thermal link 25 to the first stage 21 of the refrigerator in such a way that the temperature of the superconducting coil connectors 18 is substantially lower than the critical temperature of the HTS material. Further, as depicted in FIGS. 2 and 3, the current leads 5 each comprise an electrical connector 15 for connecting with respective current lines. Each current lead 5 comprises a first section 6 and a second section 7. The second sections 7 are thermally anchored to the first stage 21 of the refrigerator. The first sections 6, the second sections 7, and the superconducting coil connectors 18 are always galvanically and thermally connected, independent of whether they carry any current or not. The first sections 6, the second sections 7, and the superconducting coil connectors 18 are always galvanically and thermally connected, independent of whether they carry any current or not. The cross-sectional areas of the first sections of the current leads are dimensioned in a way which is not suited for thermally withstanding the predefined maximum current which is to be fed to the superconducting coil without cooling. Instead, their cross-sectional area is chosen such that the heat dissipated by the maximum magnet current can be safely removed from these parts by heat-pipe or forced flow cooling. The thicker lower sections of the leads are dimensioned, using well established methods, to provide minimum heat input to their lower ends at maximum operating current, assuming that their upper ends are at or slightly above room temperature in the operating state.

As can be seen in detail from FIG. 2, the cross-sectional area of the first section 6 is less than the cross-sectional area of the second section 7, and the current leads 5 are attached to the superconducting coil connectors 18 with their respective second sections 7. In this way, heat transfer to the first stage of the refrigerator 21 at zero current in the current leads 5 is reduced due to the first sections 6 with the smaller cross-sectional areas. In order to prevent the current leads 5 to be damaged in the first sections 6 with the smaller cross-sectional areas when the maximum magnet current is flowing through the current leads 5, the first sections 6 of the current leads 5 each comprise a cooling arrangement 8 for cooling the first sections 6 of the current leads 5. As explained before, this cooling arrangement is designed to be only active while there is current flowing through the current leads 5 and to generate no additional heat leak when the current leads 5 do not carry any current. As depicted in FIGS. 2 and 3, the current leads 5 are fed through the wall of the vacuum chamber with their first sections 6. These current leads 5 are made of the same material in their first sections and their second sections, namely of copper.

According to the preferred embodiment of the invention which is shown in FIG. 2, the cooling arrangements 8 for cooling the first sections 6 of the current leads 5 each comprise a cooling channel 10 inside the first section 6 of the respective current lead 5 for conducting a coolant. Together, these cooling channels 10 form a common cooling channel 9 for both current leads 5. In this respect, the common cooling channel 9 is comprised of a respective cooling channel 10 in the first sections 6 of the current leads 5 and a galvanically insulating coupler 11 interconnecting the cooling channels in the first sections 6 of the respective current leads 5. In this way, the two current leads 5 are thermally connected, i.e. for the purpose of cooling, while they are still galvanically isolated from each other. Alternatively, each current lead 5 could have its own supply and return channel for coolant flow; in that case no insulating coupler is needed.

According to the preferred embodiment of the invention which is shown in FIG. 3, the cooling arrangements 8 for cooling the first sections 6 of the current leads 5 each form a heat pipe 12 with which the current leads 5 are fed through the vacuum chamber wall 3. Thus, these heat pipes 12 are formed the first sections 6 of the current leads 5, respectively, both extend into the inside of the vacuum chamber 2 and are both connected to a respective heat sink 13 outside of the vacuum chamber 2 which are a condensers at the room-temperature ends of the current leads 5. In this case, the operation of the system is completely passive and automatic: In the zero-current state, the medium of the heat pipe 12, which could be water, methanol or some other suitable liquid, would freeze out at the lower end and the remaining heat transfer would be thermal conduction through the lead material.

According to the preferred embodiment of the invention an "off-the-shelf" copper heat pipe with an external diameter of 10 mm and a length of 400 mm is used. It has a sintered copper wick and the heat transport medium is water vapor. Copper blocks are soldered at both ends, a small one at the lower end for the electrical connection of the uncooled first sections 6 of the current leads 5 and a larger block at the top for the other electrical connection and to attach the heat sinks 12, 13.

As explained before, it is important that the current leads 5 each comprise at least two different sections 6, 7 with different cross sections. In this way, the heat transfer through the current leads is reduced due to their sections with smaller cross sections. Without cooling, when conducting the current for the coil, this thinner first sections 6 of the current leads would quickly heat up to temperatures above the melting point of its material. In order to prevent such thermal runaway, the thin sections 6 of the current leads 5 are equipped with a cooling arrangement 8. In this respect, the cross-sectional areas of the second sections 7 of the current leads 5 are dimensioned in a way to thermally withstand a predefined maximum current which is to be fed to the superconducting coil 1 without cooling while the cross-sectional areas of the first sections 6 of the current leads 5 are dimensioned in a way which is not suited for thermally withstanding the predefined maximum current which is to be fed to the superconducting coil 1 without cooling.

As mentioned before, without cooling, a suitable shape of a current lead for a cryogen-free magnet is a strip of bar of a conducting material such as copper with a constant cross-section over its entire length. According to the preferred embodiments of the invention described here, the cross-sectional area is reduced to approximately 15-20% of this suitable value over about 40-60% of the length of the lead. Without cooling, this thin first section 6 of the current lead 5 would quickly heat up to temperatures above the melting point of the copper which is used here as the material for the current leads 5. In order to prevent such thermal runaway, the thinner first section 5 of the current lead is equipped with the cooling arrangement 8. For an example current lead rated at 450 A maximum current, each optimum cooled lead consists of a 300 mm long cooled copper part with a cross-section of approximately 12 mm² connected in series with a 400 mm long un-cooled copper part with a cross-section of 55 mm². Each of these leads transports approx. 3.5 W to the cold end. The equivalent un-cooled current leads of the same length would have a cross-section of 75 mm² and would each cause a heat load at the cold end of about 12 W.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST superconducting coil 1
vacuum chamber 2
vacuum chamber walls 3
cryocooler 4
current leads 5
first section 6
second section 7
cooling arrangements 8
common cooling channel 9
cooling channel in the first sections of the current leads 10
galvanically insulating coupler 11
heat pipe 12
heat sink 13
MRI system 14
electrical connectors 15
cooling inlet 16
cooling outlet 17
superconducting coil connector 18
first stage of the refrigerator 21
second stage of the refrigerator 22
radiation screen 23
thermal link 24
thermal link 25
thermal link 26

The invention claimed is:

1. A cryogen-free superconducting magnet system comprising:
a superconducting coil configured to generate a magnetic field,
a vacuum chamber with vacuum chamber walls limiting the vacuum chamber to the outside, and
a cryocooler configured to cool the superconducting coil, the cryocooler comprising a refrigerator with a first stage which is adapted for being cooled to a first temperature and a second stage which is adapted for being cooled to a second temperature, the second temperature being lower than the first temperature, wherein
the superconducting coil is arranged inside the vacuum chamber at a distance from the vacuum chamber walls,
the superconducting coil is equipped with two superconducting coil connectors which are galvanically connected to two current leads which are fed through the vacuum chamber walls for providing the superconducting coil with an electric current from outside of the vacuum chamber,
each current lead comprises a first section and a second section, wherein the cross-sectional area of the first section is less than the cross-sectional area of the second section,
the current leads are galvanically attached to the superconducting coil connectors and thermally connected to the first stage of the refrigerator with their respective second sections, and
the first sections of the current leads each comprise a cooling arrangement for cooling the first sections of the current leads by heat transfer to the outside at ambient temperature, the cooling arrangements for cooling the first sections of the current leads each being connected to a single common cooling channel.

2. The cryogen-free superconducting magnet system according to claim 1, wherein the current leads are fed through the vacuum chamber walls with their first sections-.

3. The cryogen-free superconducting magnet system according to claim 1, wherein the cross-sectional areas of the first sections of the current leads are less than 25% of the cross-sectional areas of the second sections.

4. The cryogen-free superconducting magnet system according to claim 1, wherein the cross-sectional areas of the second sections of the current leads are dimensioned in a way to thermally withstand a predefined maximum current which is to be fed to the superconducting coil without cooling while the cross-sectional areas of the first sections of the current leads are dimensioned in a way which is not suited for thermally withstanding the predefined maximum current which is to be fed to the superconducting coil without cooling.

5. The cryogen-free superconducting magnet system according to claim 4, wherein the predefined maximum current is 450 A.

6. The cryogen-free superconducting magnet system according to claim 1, wherein the current leads are comprised of the same material in their first sections and their second sections.

7. The cryogen-free superconducting magnet system according to claim 1, wherein the length of the first sections of the current leads is at least 60% of the length of the second sections of the current leads.

8. The cryogen-free superconducting magnet system according to claim 1, wherein the cooling channel is disposed inside the first section of the respective current lead for conducting a coolant.

9. The cryogen-free superconducting magnet system according to claim 1, wherein the common cooling channel is comprised of a respective cooling channel in the first sections of the current leads and a galvanically insulating coupler interconnecting the cooling channels in the first sections of the respective current leads.

10. The cryogen-free superconducting magnet system according to claim 1, wherein the cooling arrangements for cooling the first sections of the current leads each comprise a heat pipe with which the current leads are fed through the vacuum chamber walls, wherein the heat pipe extends into the inside of the vacuum chamber and is connected to a heat sink outside of the vacuum chamber.

11. The cryogen-free superconducting magnet system according to claim 10, wherein the heat pipes are formed by the first sections of the current leads, respectively.

12. A magnetic resonance imaging (MRI) system with a cryogen-free superconducting magnet system according to claim 1.

13. The cryogen-free superconducting magnet system according to claim 1, wherein the length of the first sections of the current leads is at least 80% of the length of the second sections of the current leads.

14. The cryogen-free superconducting magnet system according to claim 1, wherein the length of the first sections of the current leads is more than 100% of the length of the second sections of the current leads.

15. A cryogen-free superconducting magnet system comprising:
a superconducting coil configured to generate a magnetic field,
a cryocooler configured to cool the superconducting coil, the cryocooler comprising a refrigerator with a first stage which is adapted for being cooled to a first temperature and a second stage which is adapted for being cooled to a second temperature, the second temperature being lower than the first temperature, wherein
the superconducting coil is equipped with two superconducting coil connectors which are galvanically connected to two current leads which are fed through a vacuum chamber wall for providing the superconducting coil with an electric current from outside of the vacuum chamber,
the first sections of the current leads each comprise a cooling arrangement for cooling the first sections of the current leads by heat transfer to the outside at ambient temperature, the cooling arrangements for cooling the first sections of the current leads each being connected to a single common cooling channel inside the first section of the respective current lead for conducting a coolant.

16. The cryogen-free superconducting magnet system according to claim 15, wherein the cooling channel is disposed inside the first section of the respective current lead for conducting a coolant.

17. A cryogen-free superconducting magnet system comprising:
a vacuum chamber comprising vacuum chamber walls;
a superconducting coil disposed inside the vacuum chamber and configured to generate a magnetic field, the superconducting coil including coil connectors;
a cryocooler comprising a refrigerator having a first stage which is adapted for being cooled to a first temperature and a second stage which is adapted for being cooled to a second temperature that is lower than the first temperature;
a second stage thermal link thermally connecting the superconducting coil with the second stage of the refrigerator;
current leads passing through the vacuum chamber walls, each current lead including a first section passing through the vacuum chamber walls and a second section disposed inside the vacuum chamber and galvanically connected with the first section and galvanically connected with a respective coil connector of the superconducting coil;
a first stage thermal link thermally connecting the second sections of the current leads with the first stage of the refrigerator; and
a common cooling channel thermally connecting the first sections of the current leads with an ambient outside of the vacuum chamber.

18. The cryogen-free superconducting magnet system of claim 17, wherein the second section of each current lead has a larger cross-sectional area than the first section of the current lead.

19. The cryogen-free superconducting magnet system of claim 17, wherein the common cooling channel comprises:
a galvanically insulating coupler which thermally interconnects the first sections of the current leads.

20. The cryogen-free superconducting magnet system of claim 19, wherein the common cooling channel further comprises:
embedded cooling channel portions disposed inside the first sections of the respective current leads.

* * * * *